(12) United States Patent
Cheng et al.

(10) Patent No.: US 11,780,219 B2
(45) Date of Patent: Oct. 10, 2023

(54) STENCIL PRINTING MACHINE

(71) Applicant: Illinois Tool Works Inc., Glenview, IL (US)

(72) Inventors: Zaizai Cheng, Suzhou (CN); Wenhua Su, Suzhou (CN)

(73) Assignee: Illinois Tool Works Inc., Glenview, IL (US)

( * ) Notice: Subject to any disclaimer, the term of this patent is extended or adjusted under 35 U.S.C. 154(b) by 12 days.

(21) Appl. No.: 17/278,975

(22) PCT Filed: Nov. 22, 2019

(86) PCT No.: PCT/US2019/062765
§ 371 (c)(1),
(2) Date: Mar. 23, 2021

(87) PCT Pub. No.: WO2020/112531
PCT Pub. Date: Jun. 4, 2020

(65) Prior Publication Data
US 2022/0032604 A1 Feb. 3, 2022

(30) Foreign Application Priority Data

Nov. 26, 2018 (CN) .......................... 201811418182.9
Nov. 26, 2018 (CN) .......................... 201821959379.9

(51) Int. Cl.
*B41F 15/18* (2006.01)

(52) U.S. Cl.
CPC .................................... *B41F 15/18* (2013.01)

(58) Field of Classification Search
CPC .......... B41F 15/18; B41F 15/40; B41F 15/42; B41F 15/44; B41F 31/02
See application file for complete search history.

(56) References Cited

U.S. PATENT DOCUMENTS 6,454,154 B1 * 9/2002 Pedigo ................. H05K 3/1233
  228/256
6,736,291 B1 * 5/2004 Mimura et al. ......... B41F 15/42
  222/129

(Continued)

FOREIGN PATENT DOCUMENTS

CN 104564630 * 4/2015
CN 204584240 * 8/2015

(Continued)

OTHER PUBLICATIONS

Int'l Search Report and Written Opinion Appln No. PCT/US2019/062765 dated Mar. 11, 2020.

*Primary Examiner* — Christopher E Mahoney
*Assistant Examiner* — Marissa Ferguson-Samreth
(74) *Attorney, Agent, or Firm* — Lando & Anastasi, LLP

(57) ABSTRACT

The present application relates to a stencil printing machine, which comprises a first holder device (110), a mobile device (121), two support tables (131, 132) and two driving devices (151, 152), wherein the first holder device (110) is configured to be able to horizontally reciprocate in the portrait orientation, the mobile device (121) is mounted on the first holder device (110) and is configured to be able to horizontally reciprocate in the landscape orientation on the first holder device (110), the two support tables (131, 132) are mounted at the lower end of the mobile device (121) and are used to bear corresponding solder paste jars (141, 142), the two driving devices (151, 152) are mounted on the mobile device (121) so that each of the two driving devices (151, 152) is located above a corresponding support table (131, 132) and is used to press a corresponding solder paste jar (141, 142), and the mobile device (121) is configured to be able to drive the two support tables (131, 132) and the two driving devices (151, 152) to reciprocate vertically. Two standard solder paste jars (141, 142) can be assembled for (Continued)

the stencil printing machine provided by the present application. When one solder paste jar (141, 142) is empty, solder paste supply is switched to the other solder paste jar (141, 142) and the stencil printing machine can continue to operate without stopping, thus improving the working efficiency of the stencil printing machine significantly.

10 Claims, 20 Drawing Sheets

(56) References Cited

U.S. PATENT DOCUMENTS

| | | | | |
|---|---|---|---|---|
| 2004/0244612 | A1* | 12/2004 | Willshere | ............... B41F 15/42 |
| | | | | 101/123 |
| 2010/0299916 | A1* | 12/2010 | Hiraki | ............... H01L 21/67126 |
| | | | | 29/740 |
| 2012/0145013 | A1 | 6/2012 | Doyle | |
| 2013/0199386 | A1* | 8/2013 | Lynch | ............... H05K 13/0465 |
| | | | | 101/123 |
| 2014/0366754 | A1 | 12/2014 | Kobayashi | |
| 2015/0367626 | A1* | 12/2015 | Mantani | ............... B41F 15/44 |
| | | | | 101/123 |
| 2016/0303676 | A1 | 10/2016 | Roybal | |

FOREIGN PATENT DOCUMENTS

| | | | | |
|---|---|---|---|---|
| CN | 211983746 | U * | 11/2020 | |
| EP | 768176 | A1 * | 4/1997 | ............ B41F 15/40 |
| JP | 2010240510 | A * | 10/2010 | |
| JP | 2016112736 | A * | 6/2016 | |
| TW | 201318873 | | 5/2013 | |
| WO | WO-9517307 | A1 * | 6/1995 | ............ B41F 31/00 |
| WO | 2018105016 | | 6/2018 | |
| WO | 2018189590 | | 10/2018 | |
| WO | WO-2020044387 | A1 * | 3/2020 | ............ B41F 15/08 |

* cited by examiner

STENCIL PRINTING MACHINE

RELATED APPLICATIONS

This application is a national stage application under 35 U.S.C. § 371 of PCT Application Serial No. PCT/US2019/062765, filed on Nov. 22, 2019, and entitled "A STENCIL PRINTER," and claims priority to Chinese Patent Application No. 201811418182.9, filed Nov. 26, 2018, entitled "A STENCIL PRINTER," and to Chinese Patent Application No. 201821959379.9, filed Nov. 26, 2018, entitled "A STENCIL PRINTER." The entireties of PCT Application Serial No. PCT/US2019/062765 and Chinese Patent Application No. 201811418182.9 and 201821959379.9 are incorporated herein by reference.

TECHNICAL FIELD

The present application relates to a stencil printing machine for manufacturing printed circuit boards, and in particular relates to a solder paste dispenser of the stencil printing machine.

BACKGROUND ART

During the manufacturing of surface-mounted printed circuit boards (PCBs), a stencil printing machine can be used to print solder paste on PCBs so that electronic components can be deposited on the PCBs later. A PCB with conductive surfaces is delivered into the stencil printing machine, and one or more small holes or marks (called "benchmarks") on the PCB are correctly aligned with the pores on the stencil of the stencil printing machine from below. The solder paste dispenser of the stencil printing machine is dropped from above the stencil to a height close to the stencil, and solder paste is extruded out of a solder paste jar onto the stencil. After solder paste is dispensed to the stencil, the scraper of the stencil printing machine moves close to the upper surface of the stencil so as to force solder paste into the pores on the stencil to reach the conductive surface of the PCB. Solder paste is usually dispensed from a standard solder paste jar to the stencil. The solder paste jar contains a limited amount of solder paste. After the solder paste in the solder paste jar is used up, the solder paste jar needs to be replaced with a new solder paste jar to dispense solder paste. After the printing operation, the PCB leaves the stencil and is delivered to the next processing unit in the production line.

The above-mentioned operation procedure is repeated in a large-scale production line to manufacture a huge amount of PCBs. An improved stencil printing machine is required so as to continuously repeat the corresponding operation procedure more economically and efficiently.

SUMMARY

After long-term observations and experiments, the inventor finds that the operations and time necessary for replacing a used-up solder paste jar will affect the working efficiency of a stencil printing machine. A standard solder paste jar usually contains 500 g of solder paste and can be used to print a plurality of PCBs. After the solder paste in the solder paste jar is used up, it is necessary to stop the stencil printing machine to replace the solder paste jar with a new one. In a large-scale automatic production line, frequently stopping the stencil printing machine to replace the solder paste jar will lower the working efficiency of the stencil printing machine or even the whole production line.

Two standard solder paste jars can be assembled for the stencil printing machine provided by the present application. When one solder paste jar is used up, solder paste is switched to the other solder paste jar and the stencil printing machine can continue to operate without stopping, and after the two solder paste jars are both used up, they are then replaced with new ones. In this way, the number of stops and the number of replacements are both reduced by half, and thus the working efficiency of the stencil printing machine is improved significantly.

The stencil printing machine provided by the present application comprises a first holder device, a mobile device, two support tables and two driving devices. The first holder device is configured to be able to horizontally reciprocate in the portrait orientation. The mobile device is mounted on the first holder device and is configured to be able to horizontally reciprocate in the landscape orientation on the first holder device. The two support tables are mounted at the lower end of the mobile device and each of the two support tables is used to bear a corresponding solder paste jar. The two driving devices are so mounted on the mobile device that each of the two driving devices is located above a corresponding support table, and each of the two driving devices is used to press a corresponding solder paste jar, wherein the mobile device is configured to be able to drive the two support tables and the two driving devices to reciprocate vertically.

According to the stencil printing machine, the two support tables are arranged on the two opposite sides of the mobile device so that the two support tables are arranged back to back, or the two support tables are arranged on the same side of the mobile device so that the two support tables are arranged abreast.

According to the stencil printing machine, the two driving devices include a first driving device and a second driving device, each of the first driving device and the second driving device comprises a cylinder, and the cylinder comprises a cylinder body, a piston rod and a pressure head. The cylinder body is fixed on the mobile device and the cylinder body has a chamber inside. The piston rod is arranged in the chamber and is configured to be able to vertically reciprocate according to the change of the air pressure in the chamber, and the piston rod extends downward to the outside of the cylinder body to form the lower end of the piston rod. The pressure head is connected to the lower end of the piston rod so that the pressure head can vertically reciprocate together with the piston rod.

The stencil printing machine further comprises two used solder paste amount sensing devices. Each of the two used solder paste amount sensing devices is used to sense the stroke of the piston rod of the corresponding driving device and thus sense the used solder paste amount of the corresponding solder paste jar and is configured to generate a used solder paste amount signal of the corresponding solder paste jar when the piston rod moves to a predetermined position.

According to the stencil printing machine, the used solder paste amount sensing device comprises a magnet ring and a magnetic switch. The magnet ring is put on the piston rod and is able to move together with the piston rod. The magnetic switch is mounted on the outer side of the cylinder body and the magnetic switch is configured to be able to generate the used solder paste amount signal when the magnet ring moves to a position which is a predetermined distance away from the magnetic switch.

According to the stencil printing machine, each of the two support tables comprises a base and a support, the base is mounted at the lower end of the mobile device, the lower end of the support is mounted on the base and the shape of the upper end of the support is configured to match the opening of the solder paste jar and is used to bear the solder paste jar, wherein the support has a bottom-to-top through-hole inside and the through-hole is used to extrude solder paste in the solder paste jar.

According to the stencil printing machine, the base has a downward recessed receiving portion which is used to receive the lower end of the support, wherein the bottom of the receiving portion has a circulation hole and one side of the receiving portion has an opening communicating with the receiving portion. The base further comprises a baffle, and the baffle is mounted on the side of the receiving portion and is used to open or close the opening.

The stencil printing machine further comprises a second holder device. The mobile device is mounted on the first holder device through the second holder device, the first holder device and the second holder device being detachably arranged so that the second holder device can be removed from the first holder device.

The stencil printing machine further comprises a controller, and the controller is configured to be able to control the movements of the first holder device, the mobile device and the two driving devices.

According to the stencil printing machine, the two driving devices include a first driving device and a second driving device, wherein the first driving device and the second driving device are alternately set to the working driving device, and when the first driving device is set to the working driving device, the controller is configured to be able to receive the used solder paste amount signal from the used solder paste amount sensing device corresponding to the first driving device and select the second driving device as the working driving device according to the used solder paste amount signal.

According to the stencil printing machine, when the first driving device is selected as the working driving device, the controller is configured to be able to control the working position of the first driving device, and when the second driving device is selected as the working driving device, the controller is configured to be able to add a predetermined offset to the working position of the first driving device to obtain the working position of the second driving device.

According to the stencil printing machine, the offset is the distance between the centers of the circulation holes of the two support tables.

The conception and specific structure of the present application and the technical effect which the present application brings about are described in combination with the drawings so as to help fully understand the object, characteristics and effects of the present application.

BRIEF DESCRIPTION OF THE DRAWINGS

Reading the following detailed description in combination with the drawings will help better understand the present application. In the drawings, the same reference numerals represent the same parts.

FIGS. 5A to 5E show the process of solder paste extrusion, wherein FIG. 5A shows the initial state, FIG. 5B shows the state when the pressure head moves down to touch the bottom surface of the solder paste jar, FIG. 5C shows the state when the pressure head presses down the solder paste jar to extrude solder paste, FIG. 5D shows the state when the solder paste in the solder paste jar is completely extruded, and FIG. 5E shows the reset state.

DETAILED DESCRIPTION

Figure 1:
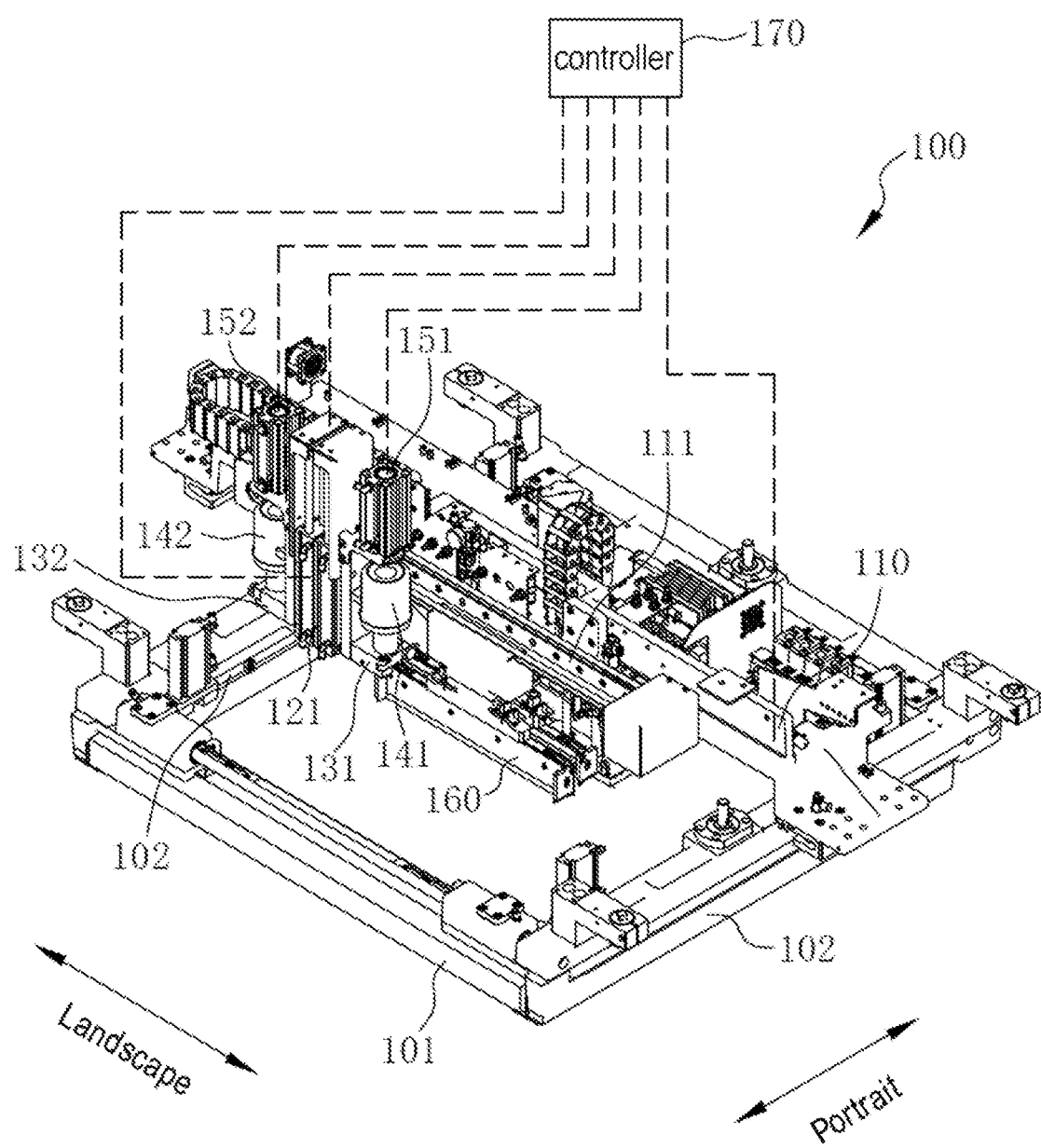
FIG. 1 shows the structure of one embodiment of the stencil printing machine of the present application.

Various specific implementation modes of the present application will be described below by reference to the drawings which constitute a part of the present description. It should be understood that although the terms indicating directions, such as "front", "rear", "above", "below", "left", "right", "inside", "outside", "top", "bottom", "near end", "far end", "landscape" and "portrait" are used to describe various exemplified structural parts and components in the present application, these terms are just used for the convenience of illustrations and are determined based on the exemplified directions in the drawings. Since the embodiments disclosed in the present application can be set in different directions, these terms indicating directions are only used as illustrations, instead of restrictions.

FIG. 1 shows the structure of one embodiment of the stencil printing machine 100 of the present application. As shown in FIG. 1, the stencil printing machine 100 comprises an operating platform 101, a first holder device 110, a second holder device 250 (see FIG. 2A) and a mobile device 121. The operating platform 101 is horizontally arranged, is roughly in the shape of a rectangle and the stencil (not shown) for printing PCBs is put in the middle of the operating platform 101. A guide rail 102 is arranged on the two sides of the operating platform 101 in the portrait orientation. The first holder device 110 is mounted on the operating platform 101 and can horizontally reciprocate in the portrait orientation on the guide rails 102. A guide rail 111 is arranged in the landscape orientation on the first holder device 110. The second holder device 250 is mounted on the first holder device 110 and can horizontally reciprocate in the landscape orientation on the guide rail 111. The mobile device 121 is mounted on the first holder device 110 through the second holder device 250. The mobile device 121 comprises a component which can reciprocate vertically. The mobile device 121 is used to move solder paste dispensers. In the embodiment in FIG. 1, the mobile device 121 is a cylinder and the component which can reciprocate vertically is a piston rod of the cylinder. Through the above-mentioned settings, the mobile device 121 can drive the solder paste dispensers to move horizontally and vertically, and thus the solder paste dispensers can dispense solder paste to the expected positions on the operating platform 101.

In the present application, two solder paste dispensers are arranged for the stencil printing machine 100, the first solder paste dispenser comprises a first support table 131 for bearing a first solder paste jar 141 and a first driving device 151 for pressing the first solder paste jar 141, and the second solder paste dispenser comprises a second support table 132 for bearing a second solder paste jar 142 and a second driving device 152 for pressing the second solder paste jar 142. The first support table 131 and the first driving device 151 are fixed on one side of the mobile device 121, the second support table 132 and the second driving device 152 are fixed on the other side of the mobile device 121, and thus the two solder paste dispensers are arranged back to back. The mobile device 121 can drive the two solder paste dispensers to vertically reciprocate.

The first support table 131 is mounted at the lower end of the mobile device 121. The first solder paste jar 141 is arranged on the first support table 131, with the opening facing downward and the bottom surface facing upward. The first driving device 151 is mounted above the first support table 131 and is equipped with a pressure head 423 which can reciprocate vertically relative to the first support table 131 (see FIGS. 5A to 5C). As the pressure head 423 of the first driving device 151 moves downward relative to the first support table 131, the pressure head 423 can press the bottom surface of the first solder paste jar 141 downward to extrude solder paste downward out of the first solder paste jar 141. In the embodiment in FIG. 1, the first driving device 151 is a cylinder. The second solder paste dispenser has the same structure as that of the first solder paste dispenser, and it is not described here again.

When printing operations are performed, the mobile device 121 lowers the solder paste dispenser to a proper height above the stencil so as to extrude solder paste toward the stencil. When the mobile device is in other states, for example, when the mobile device moves horizontally or is in standby mode, the mobile device 121 lifts the solder paste dispenser so as to perform other operations.

In the embodiment in FIG. 1, the first holder device 110 and the second holder device 250 are detachably arranged so that the second holder device 250 can be removed from the first holder device 110 to facilitate the replacement of the solder paste jar on the solder paste dispenser.

The stencil printing machine 100 further comprises a scraper 160 mounted on the first holder device 110. After solder paste is extruded to the stencil, the scraper 160 can be driven by the first holder device 110 to move close to the upper surface of the stencil to force solder paste into the pores on the stencil to reach the conductive surface of a PCB, thus completing printing operations.

The stencil printing machine 100 further comprises a controller 170. The controller 170 is configured to be able to control the moving positions and working positions of the first holder device 110, the second holder device 250, the mobile device 121, the scraper 160 and the driving devices 151, 152 so that they can cooperate with each other to complete printing operations for the PCB. The controller 170 may comprise any proper control device or control component, for example, one or more processors, memories and programmable circuits.

Figure 2A:
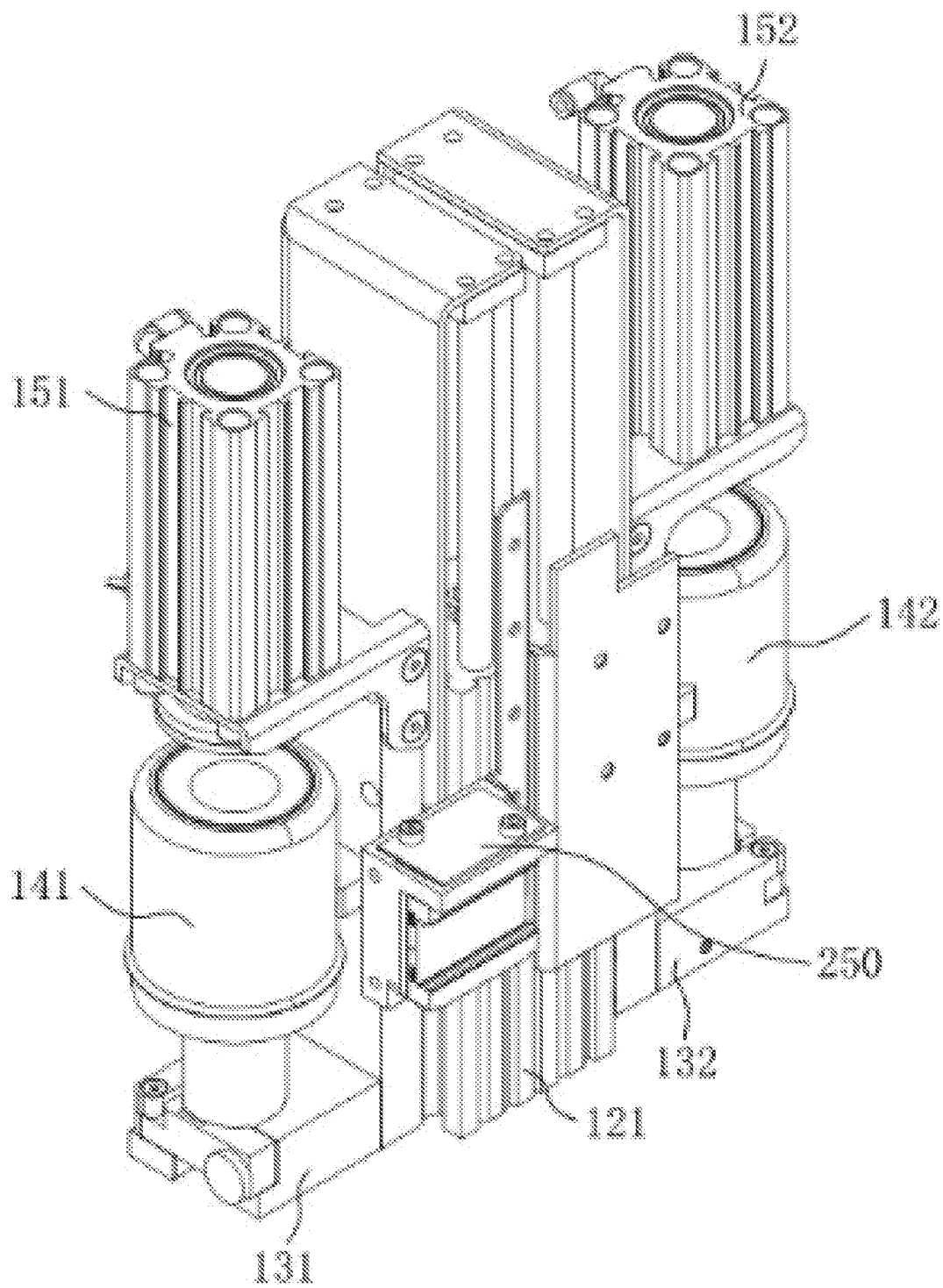
FIG. 2A shows the rear side structure of the second holder device and two solder paste dispensers in the embodiment in FIG. 1.
Figure 2B:
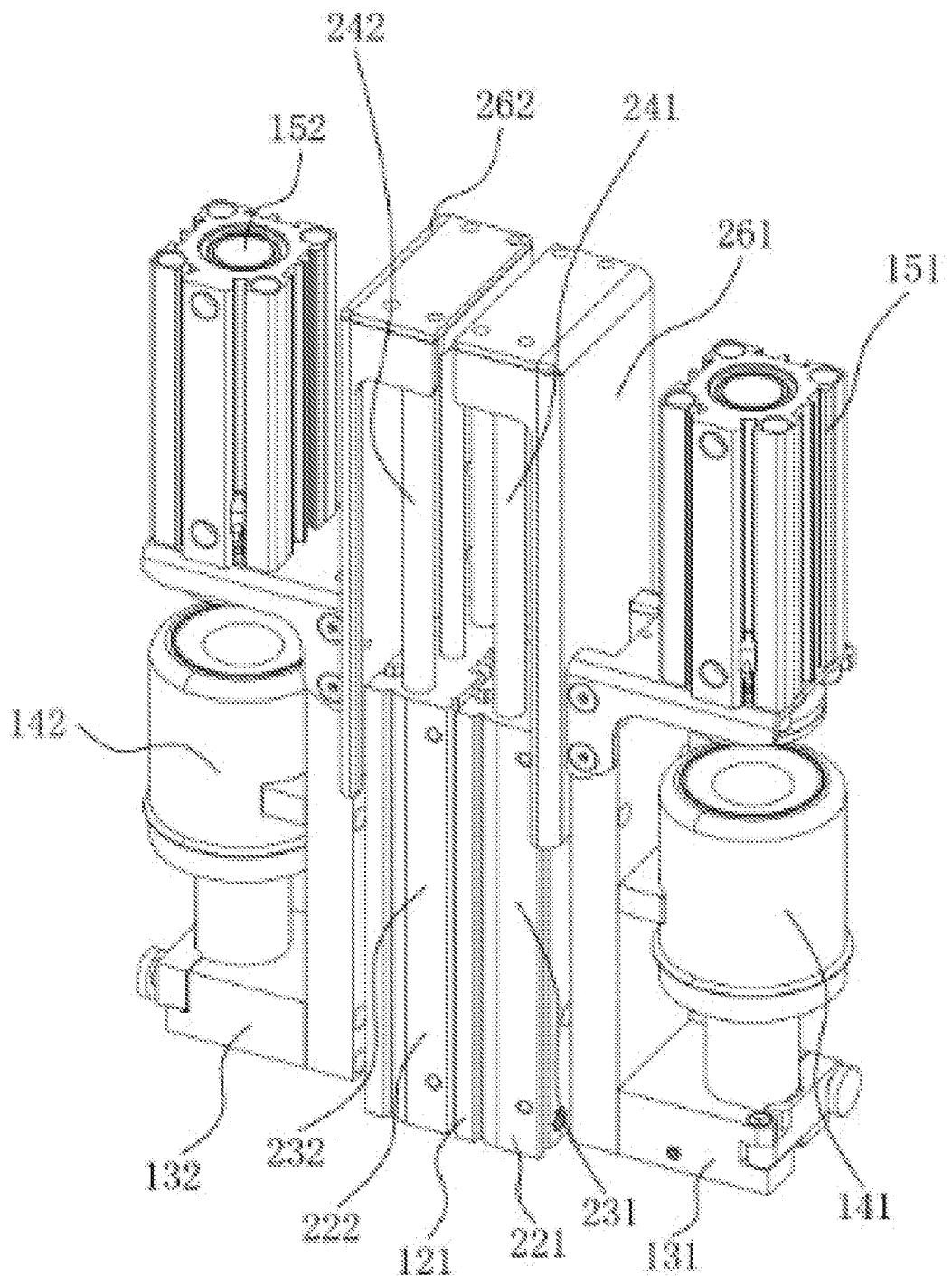
FIG. 2B shows the front side structure of the second holder device and two solder paste dispensers in the embodiment in FIG. 1.

FIGS. 2A and 2B show the 3-D structure of the two solder paste dispensers in the embodiment in FIG. 1, viewed from the rear and the front, respectively, wherein FIG. 2A further shows the second holder device 250.

As shown in FIGS. 2A and 2B, the mobile device 121 comprises a first cylinder 221 and a second cylinder 222, which are respectively used to drive the first solder paste dispenser and the second solder paste dispenser to reciprocate vertically. The first cylinder 221 and the second cylinder 222 are arranged abreast. The first cylinder 221 has a cylinder body 231 and a piston rod 241. The second cylinder 222 has a cylinder body 232 and a piston rod 242. The cylinder bodies 231, 232 of the first cylinder 221 and the second cylinder 222 are mounted on the first holder device 110 through the second holder device 250, and the piston rods 241, 242 of the first cylinder 221 and the second cylinder 222 can reciprocate vertically relative to the cylinder bodies 231, 232. The two solder paste dispensers are arranged back to back on the two sides of the mobile device 121, wherein the first support table 131 and the first driving device 151 are fixedly connected to the driving end of the piston rod 241 of the first cylinder 221 through a support plate 261, and thus the first driving device can be driven by the piston rod 241 of the first cylinder 221 to reciprocate vertically. The second support table 132 and the second driving device 152 are fixedly connected to the driving end of the piston rod 242 of the second cylinder 222 through a support plate 262, and thus the second driving device can be driven by the piston rod 242 of the second cylinder 222 to reciprocate vertically. In other embodiments, the mobile device 121 may also comprise only one cylinder and the two solder paste dispensers are fixedly mounted on the same cylinder. It should be noted that in other embodiments no second holder device 250 may be arranged, and in this case, the mobile device 121 can directly be connected to the first holder device 110.

Figure 3A:
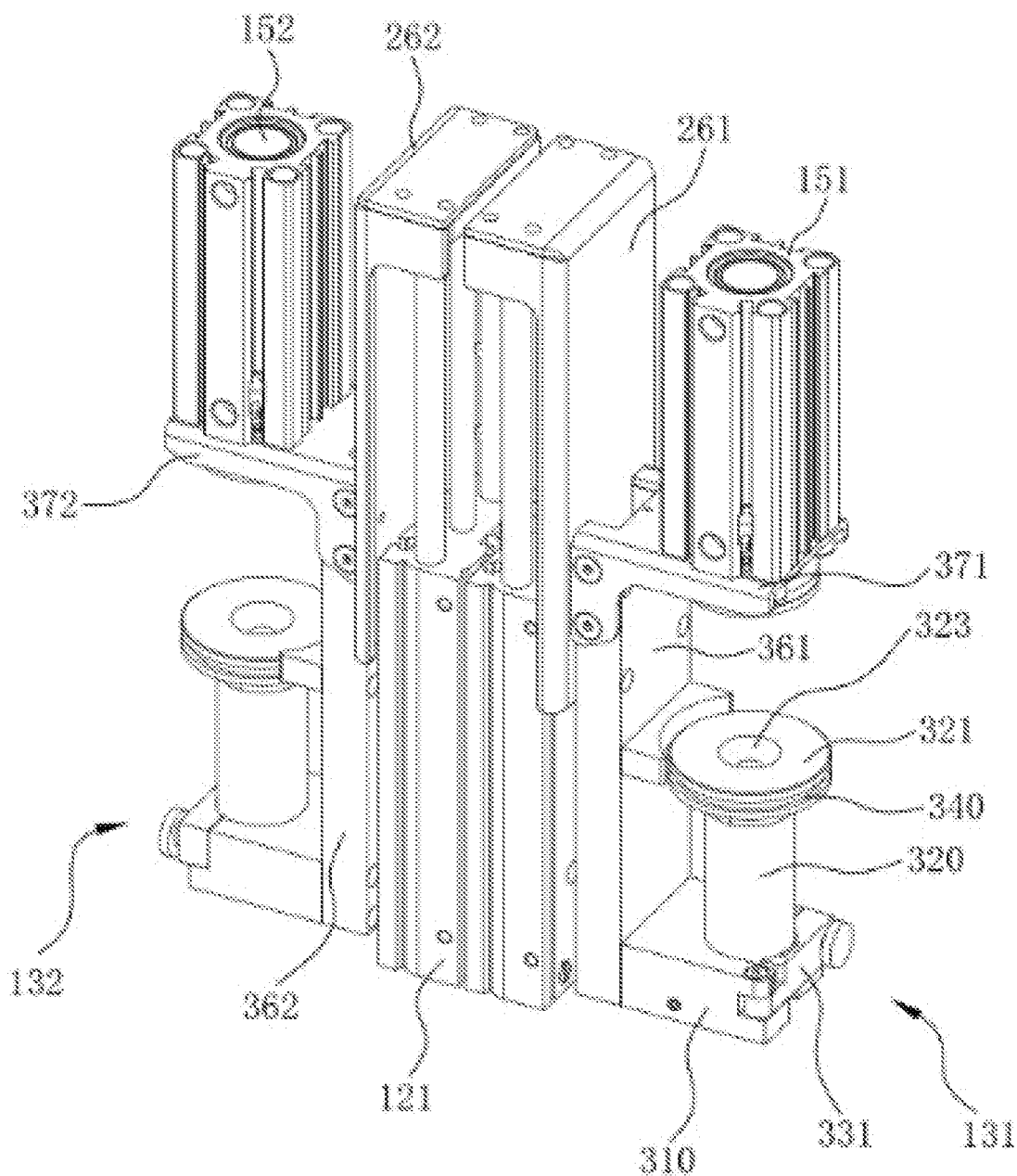
FIG. 3A shows the structure of the embodiment in FIGS. 2A and 2B, with the solder paste jars removed.
Figure 3B:
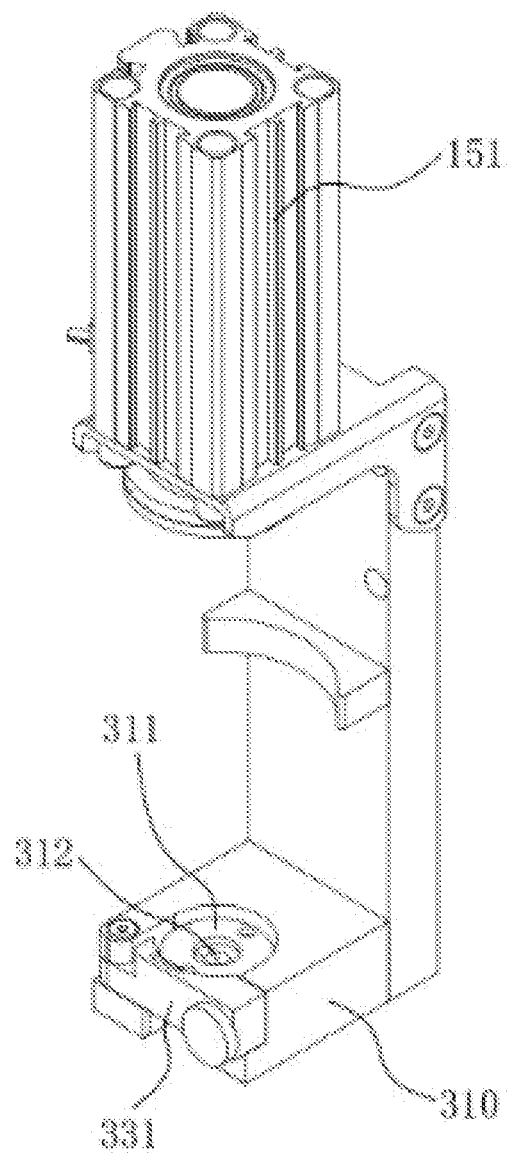
FIG. 3B shows the structure of a solder paste dispenser in the embodiment in FIG. 3A, with the support removed.
Figure 3C:
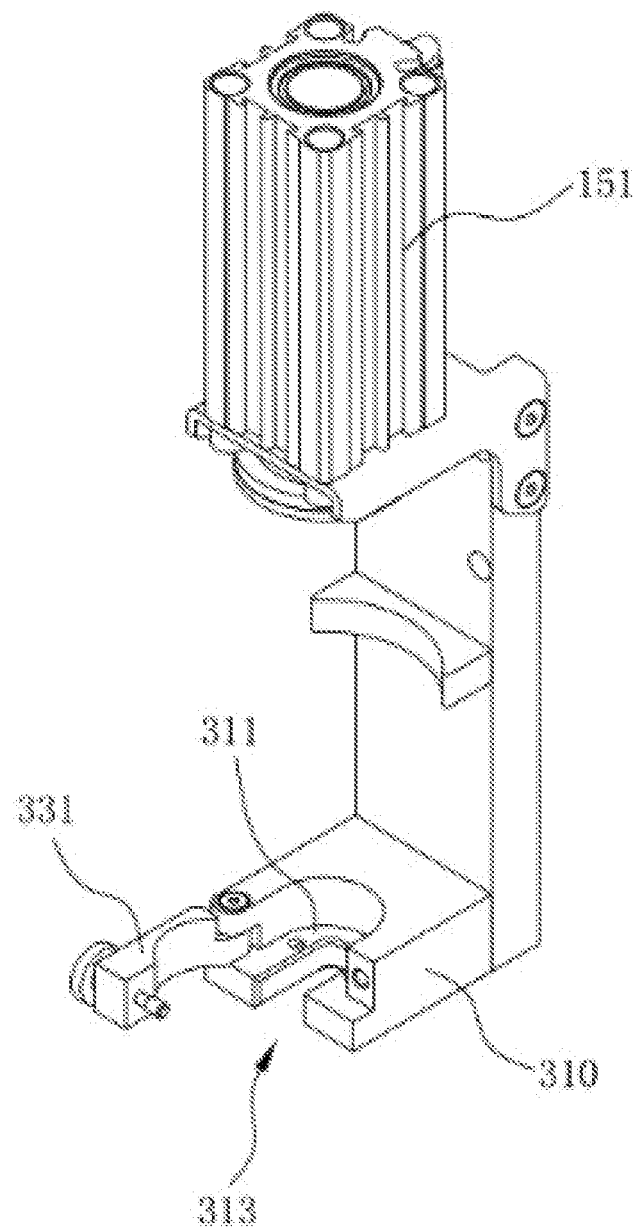
FIG. 3C shows the structure of the embodiment in FIG. 3A, with the baffle opened.
Figure 3D:
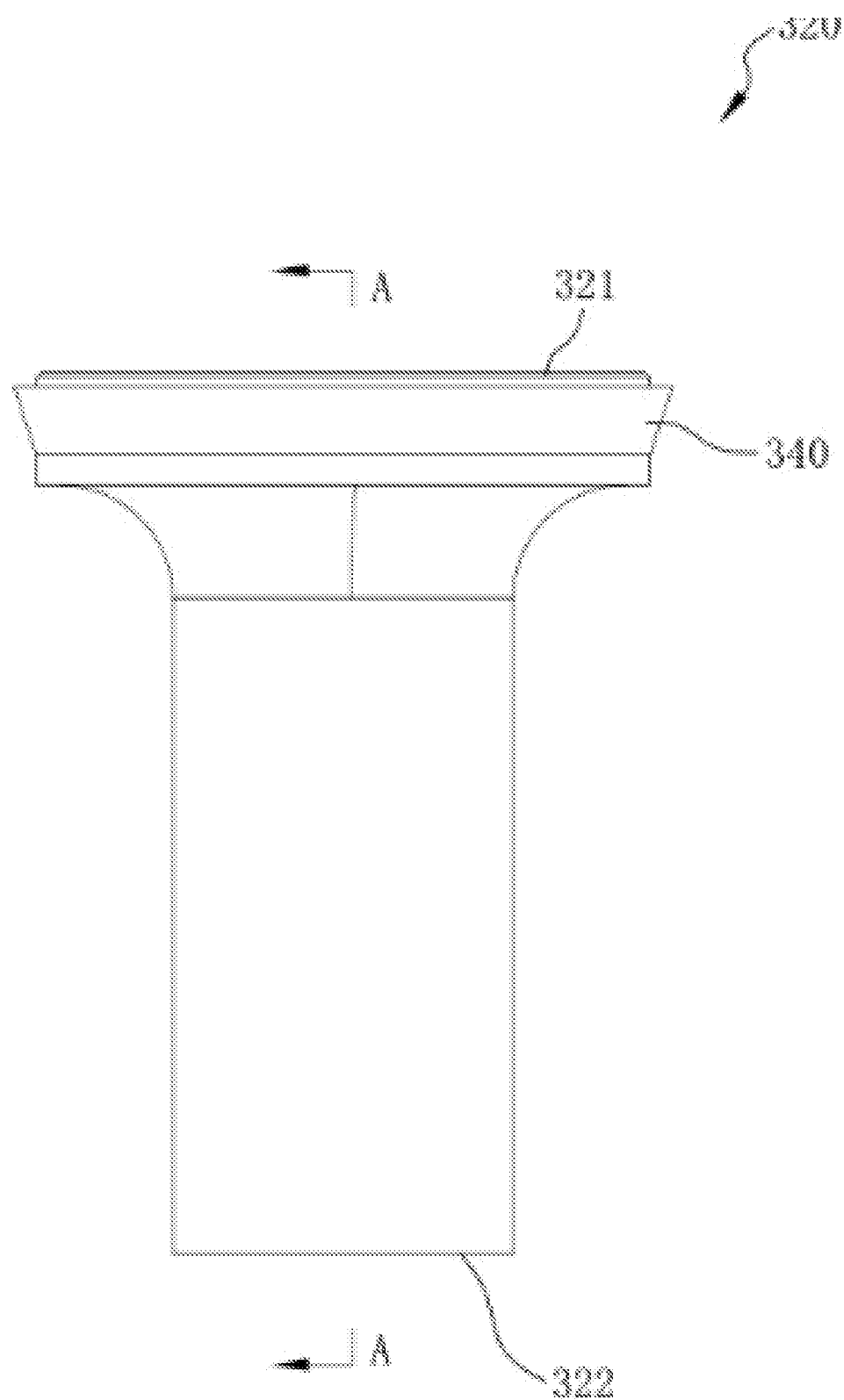
FIG. 3D is a side view of the support.
Figure 3E:
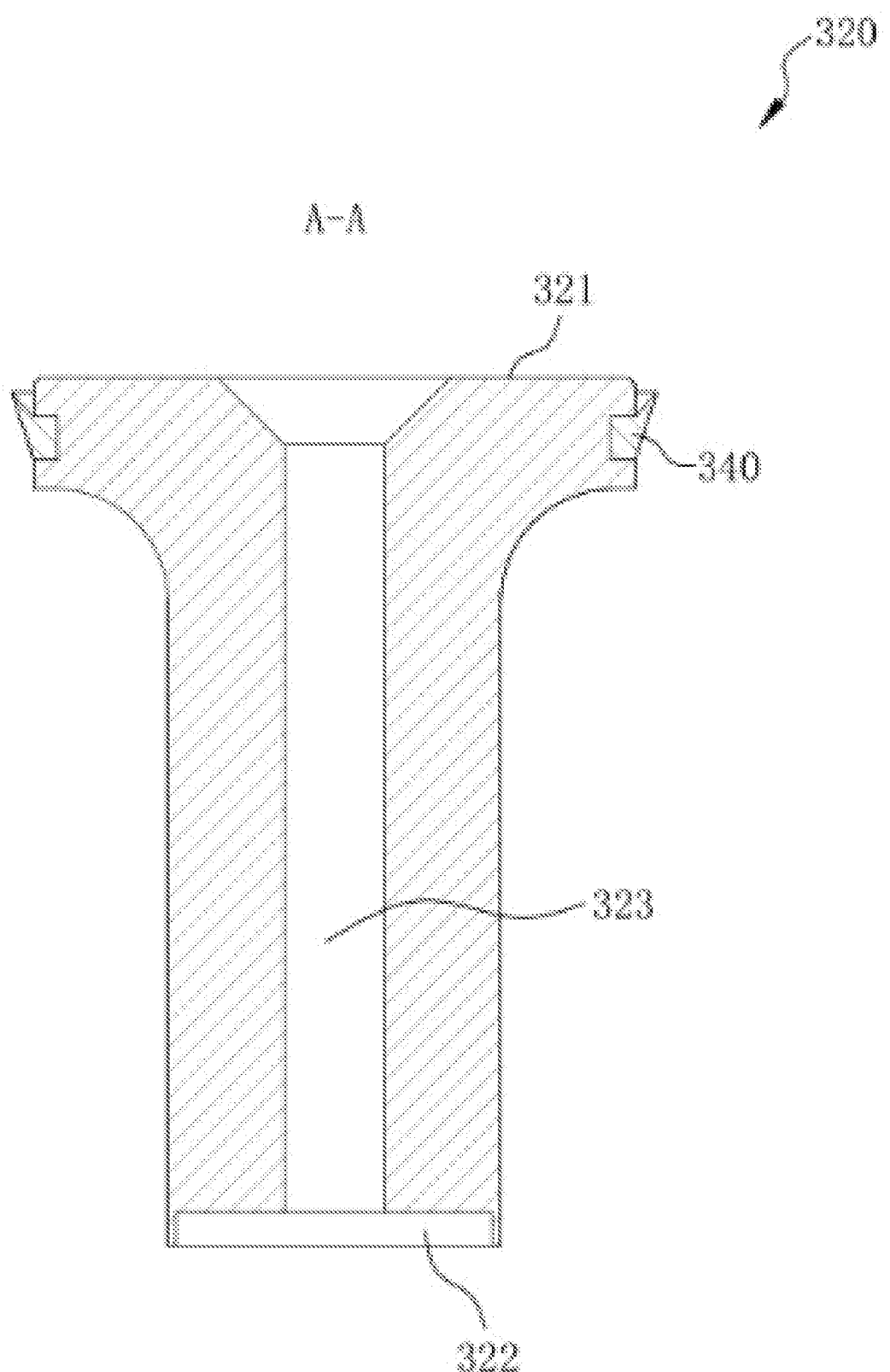
FIG. 3E is a cutaway view of the support in the A-A direction in FIG. 3C.

FIG. 3A shows the structure of the embodiment in FIGS. 2A and 2B, with the solder paste jars 141, 142 removed. FIG. 3B shows the structure of a solder paste dispenser in the embodiment in FIG. 3A, with the support 320 removed. FIG. 3C shows the structure of the embodiment in FIG. 3A, with the baffle 331 opened, FIG. 3D is a side view of the support 320, and FIG. 3E is a cutaway view of the support 320 in the A-A direction in FIG. 3C.

As shown in FIGS. 3A to 3E, the first support table 131 is mounted on one side of the support plate 261. The first support table 131 comprises a base 310, a support 320, a connecting plate 361 extending vertically and a connecting plate 371 extending horizontally. The base 310 is mounted at the lower end of the connecting plate 361, and the connecting plate 371 is mounted at the upper end of the connecting plate 361. The first driving device 151 is borne by the connecting plate 371. The support 320 has a bottom-to-top through-hole 323 inside. The lower end of the support 320 is mounted on the base 310, and the shape of the upper end 321 of the support 320 is configured to match the opening of the solder paste jar so that the solder paste jar 141, 142 can be inverted on the upper end 321 of the support 320, with the opening facing downward, and solder paste in the solder paste jar 141, 142 can flow out only through the through-hole 323 in the support 320. A seal ring 340 is further arranged around the upper end 321 of the support 320 so that a slipper seal is formed between the outer circumference of the upper end 321 and the inner wall of the solder paste jars 141, 142 to prevent a solder paste leakage. It should be noted that although the first driving device 151 is borne by the first support table 131 in the above-mentioned embodiment, no connecting plate 371 extending horizontally may be arranged on the first support table 131 and the first driving device 151 can be directly connected to the support plate 261 in other embodiments.

The base 310 has a downward recessed receiving portion 311 which is used to receive the lower end 322 of the support 320. The bottom of the receiving portion 311 has a circulation hole 312, and when the support 320 is mounted on the base 310, the circulation hole 312 communicates with the through-hole 323 in the support 320. The receiving portion 311 has an opening 313 communicating with the receiving portion 311 on the outer side, and the baffle 331 is mounted on the outer side of the receiving portion 311 and is used to open or close the opening 313. One end of the baffle 331 can rotationally be connected to one end of the opening 313, and the other end of the baffle 331 can be screw-connected with or snapped into the other end of the opening 313.

When a solder paste jar is put into the base 310 or removed from the base 310, the solder paste jar is usually put or removed together with the support 320. To be specific, when a solder paste jar needs to be put into the base 310, the upper end 321 of the support 320 is first inserted into the opening of the solder paste jar, and then the lower end 322 of the support 320 is mounted into the recessed receiving portion 311 of the base 310. When the solder paste jar needs to be removed from the base 310, the support 320 together with the solder paste jar which is upside down put on the support 320 is removed from the base 310 for a solder paste jar replacement. With the opening 313 and the baffle 331 arranged, the opening 313 is revealed when the baffle 331 is opened so that the support 320 together with the solder paste jar 141, 142 arranged on the support 320 can be put into the base 310 or removed from the base 310 via the opening 313 side of the base 310. Such settings ensure more convenient replacements and installations of solder paste jars in a limited operation space (especially a limited operation space in the vertical direction). After the support 320 is mounted on the base 310, the support 320 can be fixed by closing the baffle 331.

The second support table 132 has the same structure as that of the first support table 131 and it is not described here again.

Figure 4A:
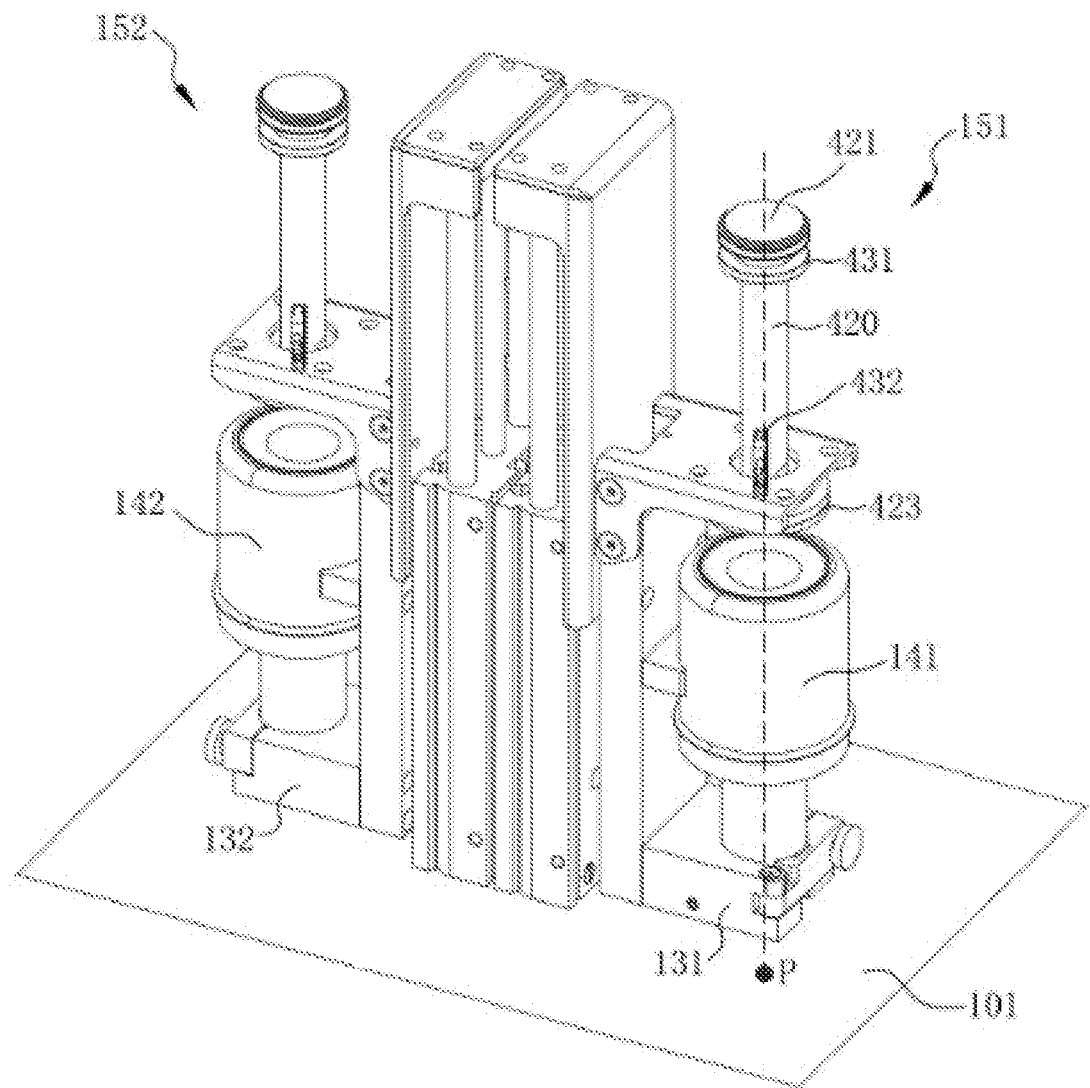
FIG. 4A shows the structure of the cylinder body in the embodiment in FIGS. 2A and 2B, with the driving devices removed.
Figure 4B:
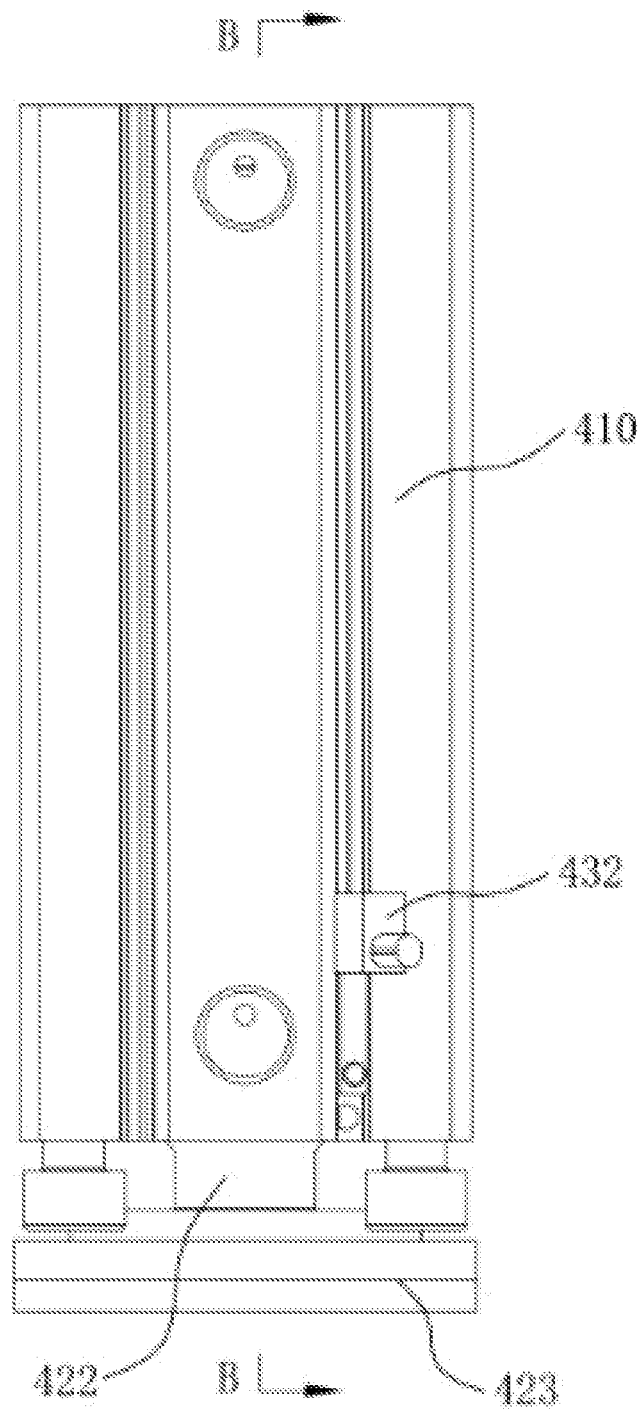
FIG. 4B is a side view of the driving device.
Figure 4C:
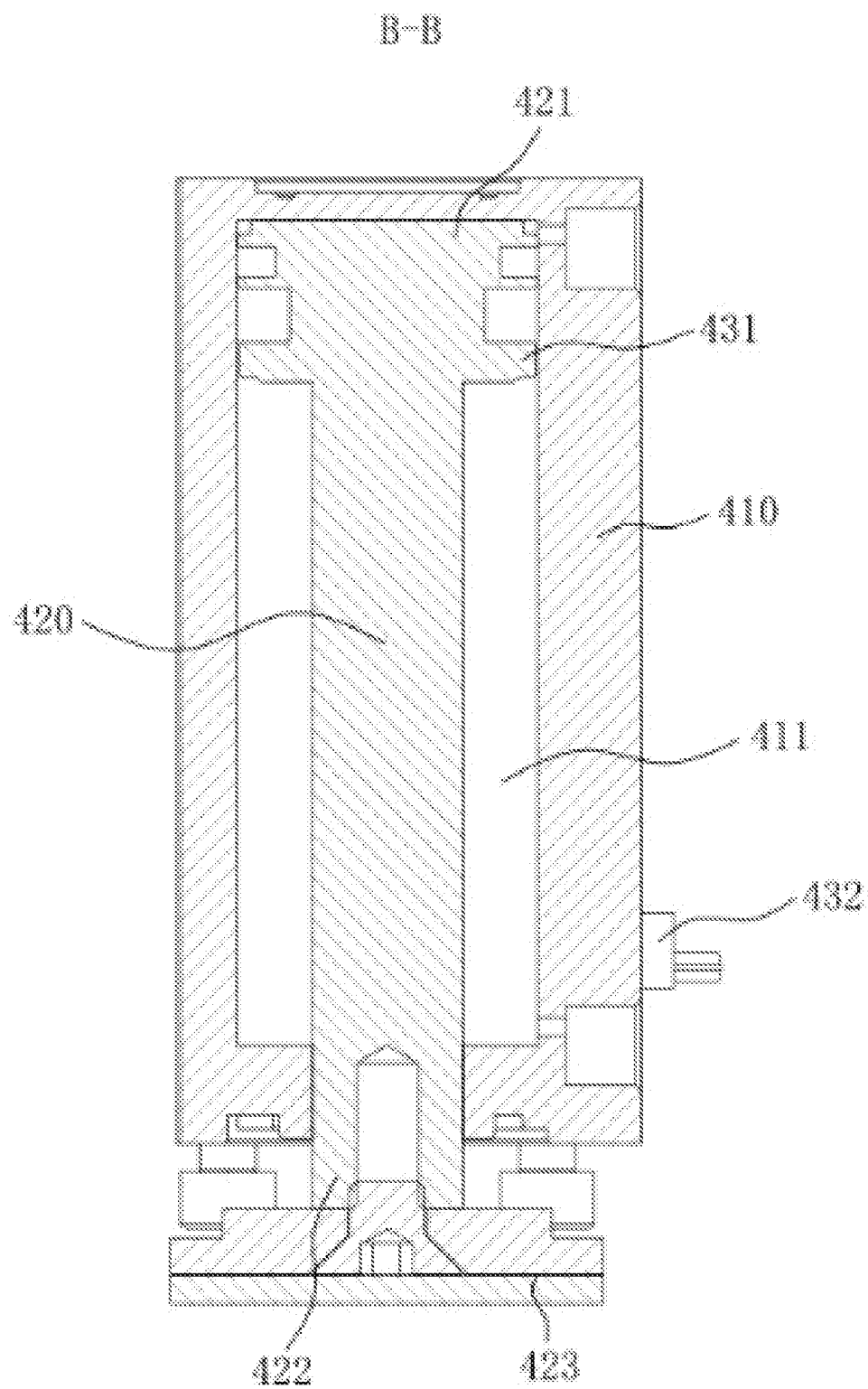
FIG. 4C is a cutaway view of the driving device in the B-B direction in FIG. 4B.
Figure 4D:
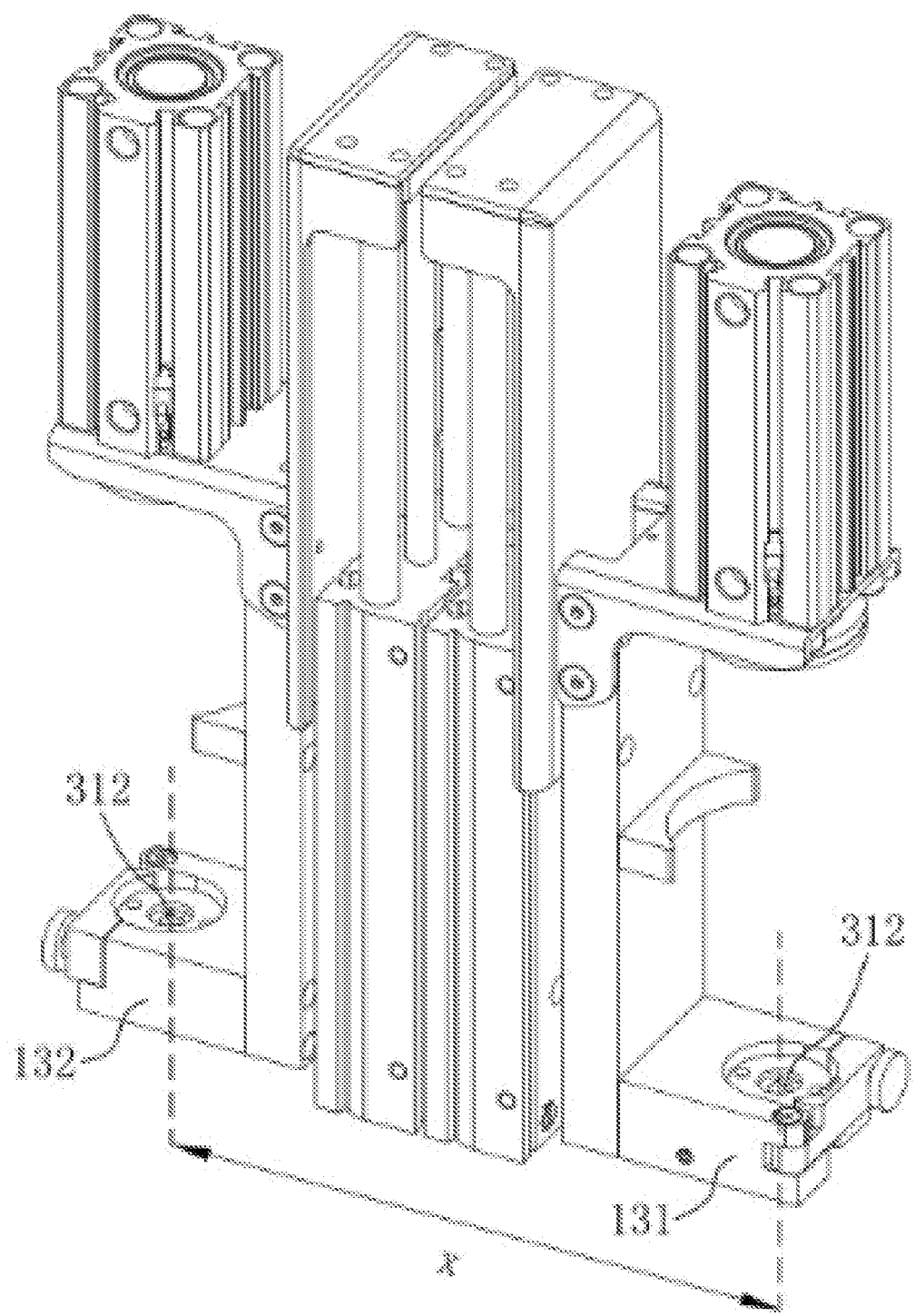
FIG. 4D shows the structure of the solder paste dispenser in FIG. 3A, with the support removed.
Figure 5A:
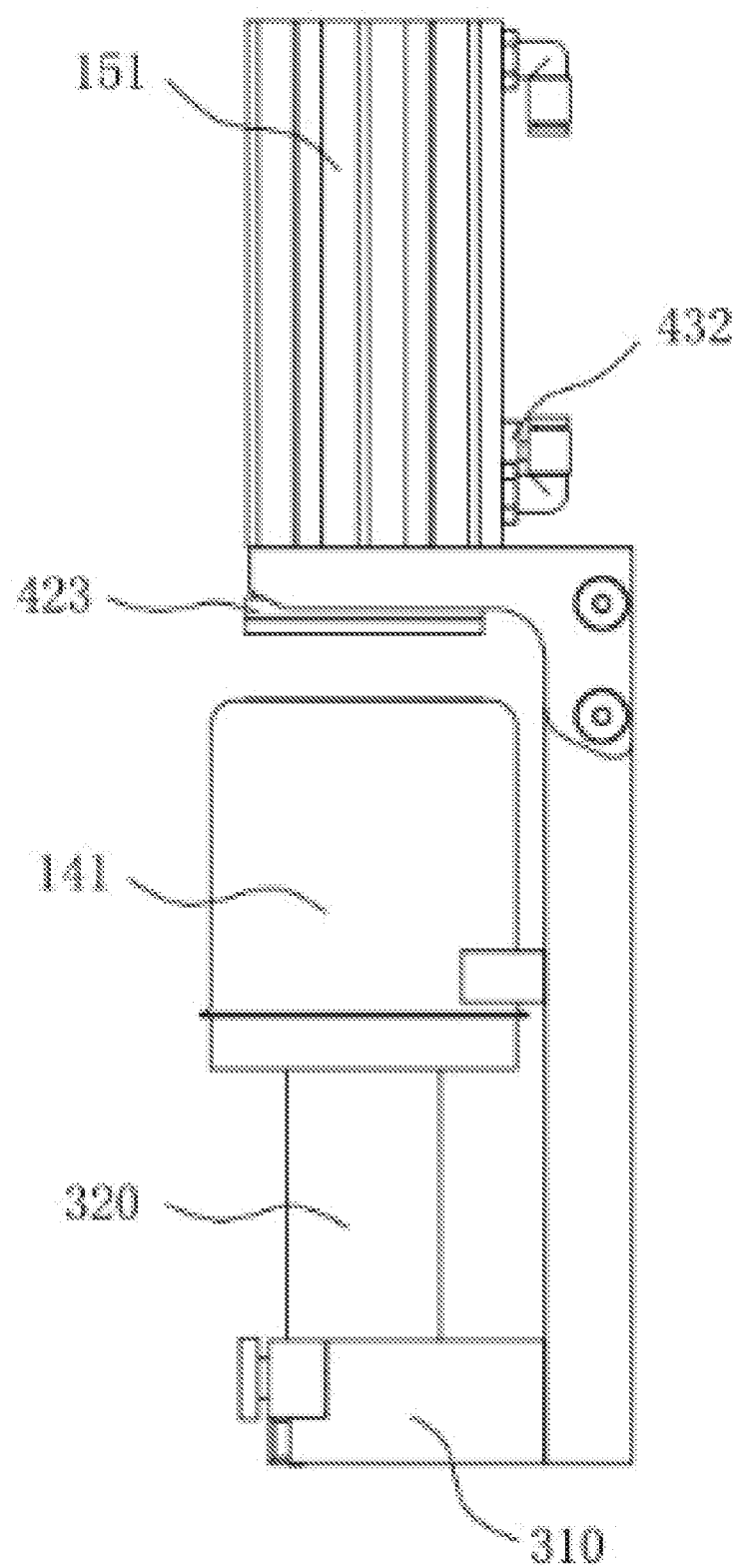
Figure 5B:
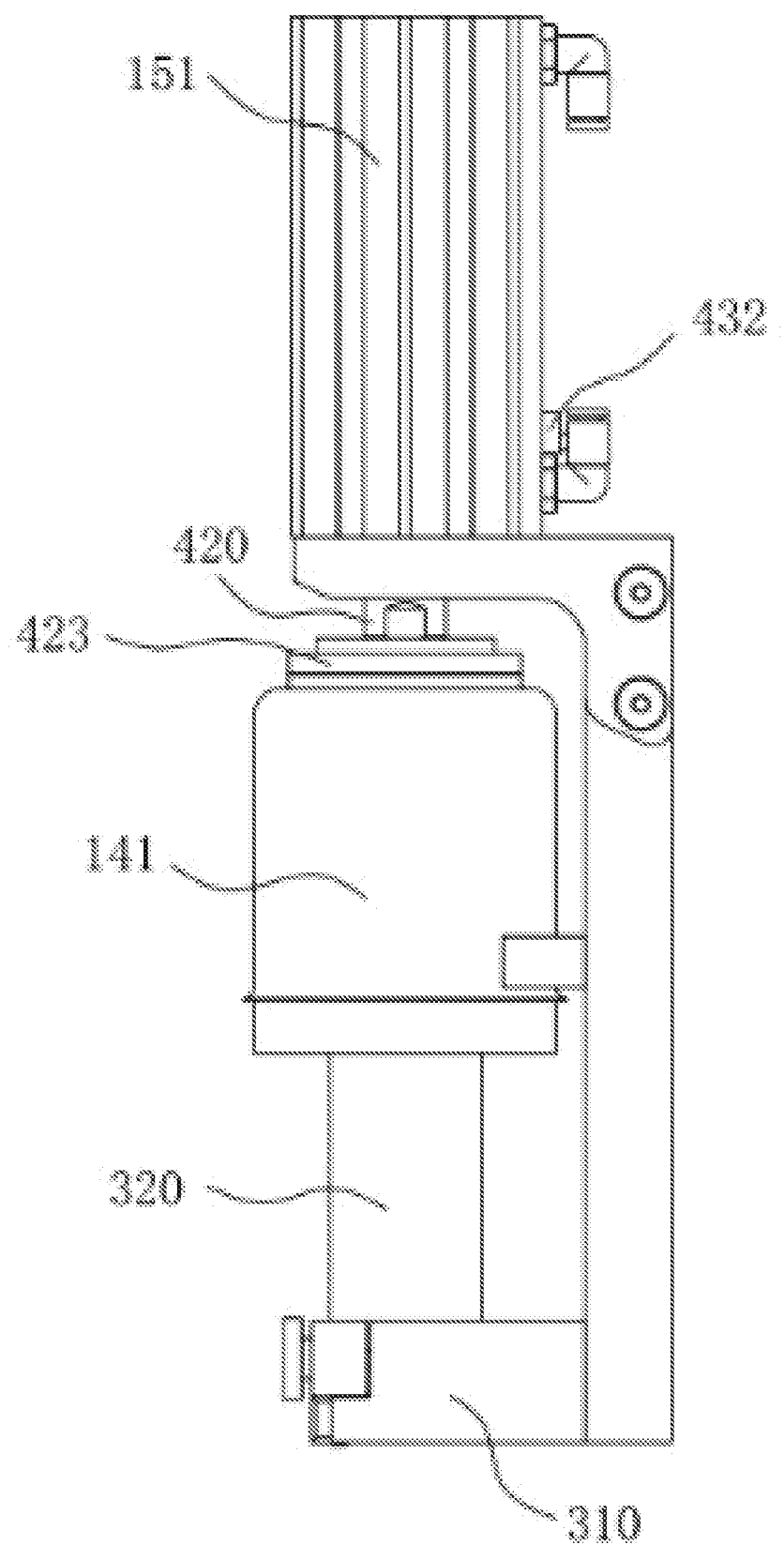

FIG. 4A shows the structure of the cylinder body 410 in the embodiment in FIGS. 2A and 2B, with the driving device 151, 152 removed, FIG. 4B is a side view of the driving device 151, 152, FIG. 4C is a cutaway view of the driving device 151, 152 in the B-B direction in FIG. 5B, and FIG. 4D shows the structure of the solder paste dispenser in FIG. 3A, with the support 320 removed.

As shown in FIGS. 4A to 4C, the driving devices 151, 152 are a cylinder. The driving devices 151, 152 have the same structure, and the driving device 151 is taken as an example to describe the specific structure of the two driving devices. The driving device 151 comprises a cylinder body 410, a piston rod 420 and a pressure head 423. The cylinder body 410 is borne by the connecting plate 371 of the first support table 131, with the opening facing downward. An opening for the piston rod 420 to pass through is arranged on the connecting plate 371. The cylinder body 410 has a chamber 411 inside. The piston rod 420 is arranged in the chamber 411, a slipper seal exists between the upper end 421 of the piston rod 420 and the inner wall of the cylinder body 410, and the piston rod can reciprocate vertically according to the change of the air pressure in the chamber 411. The piston rod 420 extends downward to the outside of the cylinder body 410 to form the lower end 422 of the piston rod 420. The pressure head 423 is connected to the lower end 422 of the piston rod 420 so that the pressure head 423 can vertically reciprocate together with the piston rod 420. The shape of the pressure head 423 is configured to match the bottom surface of the solder paste jar 141, 142 to help the pressure head to press the bottom surface of the solder paste jar 141, 142 downward.

Each of the driving devices 151, 152 is correspondingly equipped with a used solder paste amount sensing device, which is used to sense the stroke of the piston rod 420 in the corresponding driving device 151, 152 and thus sense the used solder paste amount in the corresponding solder paste jar 141, 142. The used solder paste amount sensing device is configured to generate a corresponding used solder paste amount signal to indicate whether the solder paste in the corresponding solder paste jar 141, 142 is used up when the piston rod 420 moves to a predetermined position.

The used solder paste amount sensing device comprises a magnet ring 431 and a magnetic switch 432. The magnet ring 431 is put on the piston rod 420 and is able to move together with the piston rod 420. The magnetic switch 432 is mounted on the outer side of the cylinder body 410 and the magnetic switch 432 is configured to be able to generate a corresponding used solder paste amount signal when the magnet ring 431 moves to a position which is a predetermined distance away from the magnetic switch 432.

The controller 170 is connected to the magnetic switch 432 and can receive the used solder paste amount signal from the magnetic switch 432. When the controller 170 receives a used solder paste amount signal indicating that the solder paste in the first solder paste jar 141 is used up from the corresponding magnetic switch 432 of the first driving device 151, the controller 170 selects the second driving device 152 as the working driving device to replace the first driving device 151.

As shown in FIG. 4D, the distance between the centers of the circulation holes 312 of the first support table 131 and the second support table 132 is x. The distance x is also the distance between the centers of the through-holes 323 in the two supports after the supports 320 on the first support table 131 and the second support table 132 are mounted in place.

As shown in FIG. 4A, when the first solder paste dispenser in the working position aligns with dispensing position P on the operating platform 101 to dispense solder paste, if the controller 170 receives a used solder paste amount signal indicating that the solder paste in the first solder paste jar 141 is used up from the corresponding magnetic switch 432 of the first driving device 151, the controller 170 selects the second driving device 152 as the working driving device to replace the first driving device 151. However, before solder paste is dispensed through the second driving device 152 of the second solder paste dispenser, the second solder paste dispenser needs to be moved a predetermined offset to align the dispensing position P so that the second solder paste dispenser can continue the solder paste dispensing which the first solder paste dispenser has not completed. That is to say, the controller 170 needs to add a predetermined offset to the working position of the first driving device 151 to obtain the working position of the second driving device 152. The offset is the distance x (shown in FIG. 4D) between the centers of the circulation holes 312 of the first support table 131 and the second support table 132. After the working driving device is switched to the second driving device 152, the stencil printing machine can use the second solder paste jar 142 to continue printing operations.

If the working position of the second driving device 152 is obtained by adding a predetermined offset to the working position of the first driving device 151, it is unnecessary to arrange separate control programs for the two driving devices in solder paste dispensing operations, and thus control operations for solder paste dispensing are simplified.

Figure 5C:
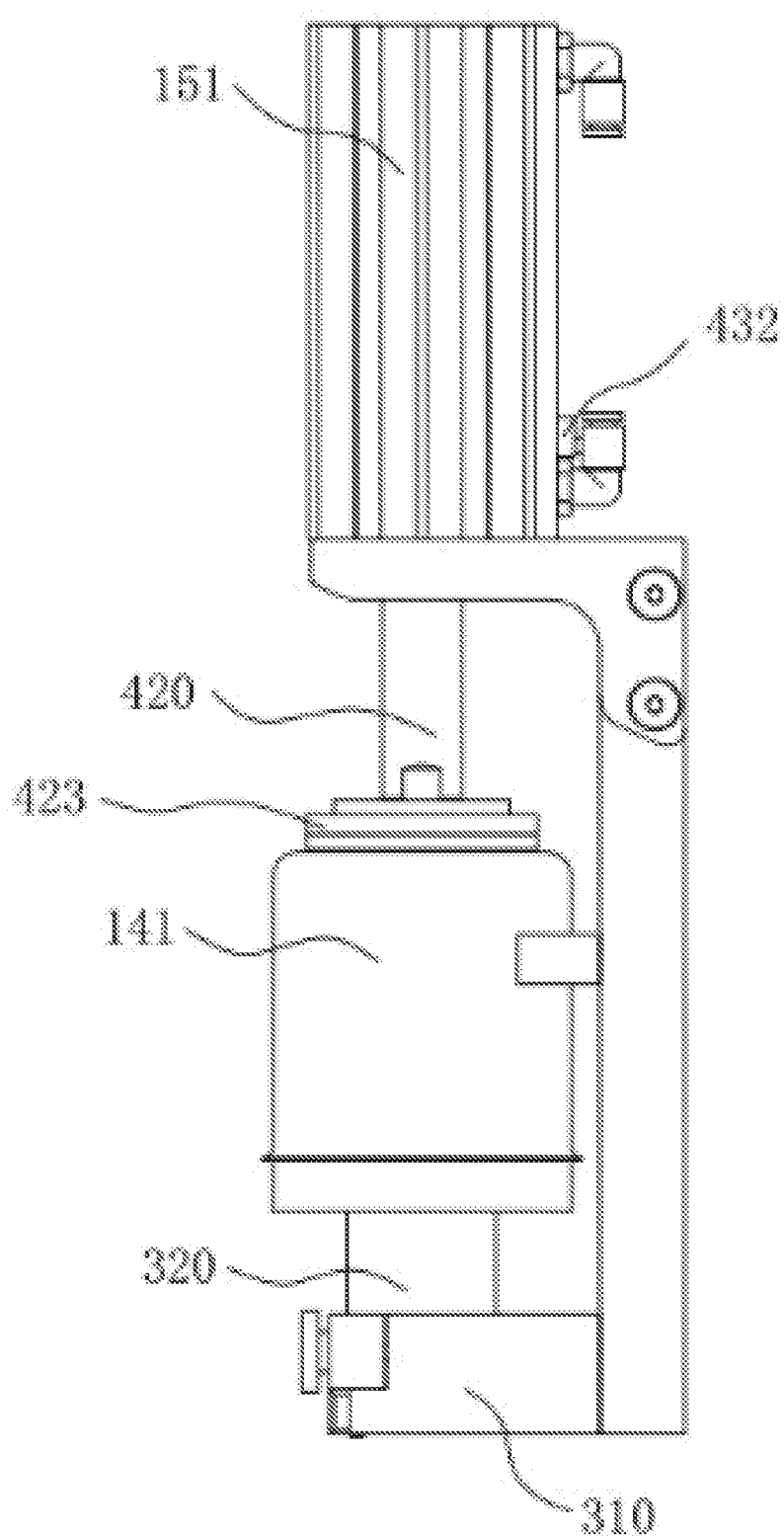
Figure 5D:
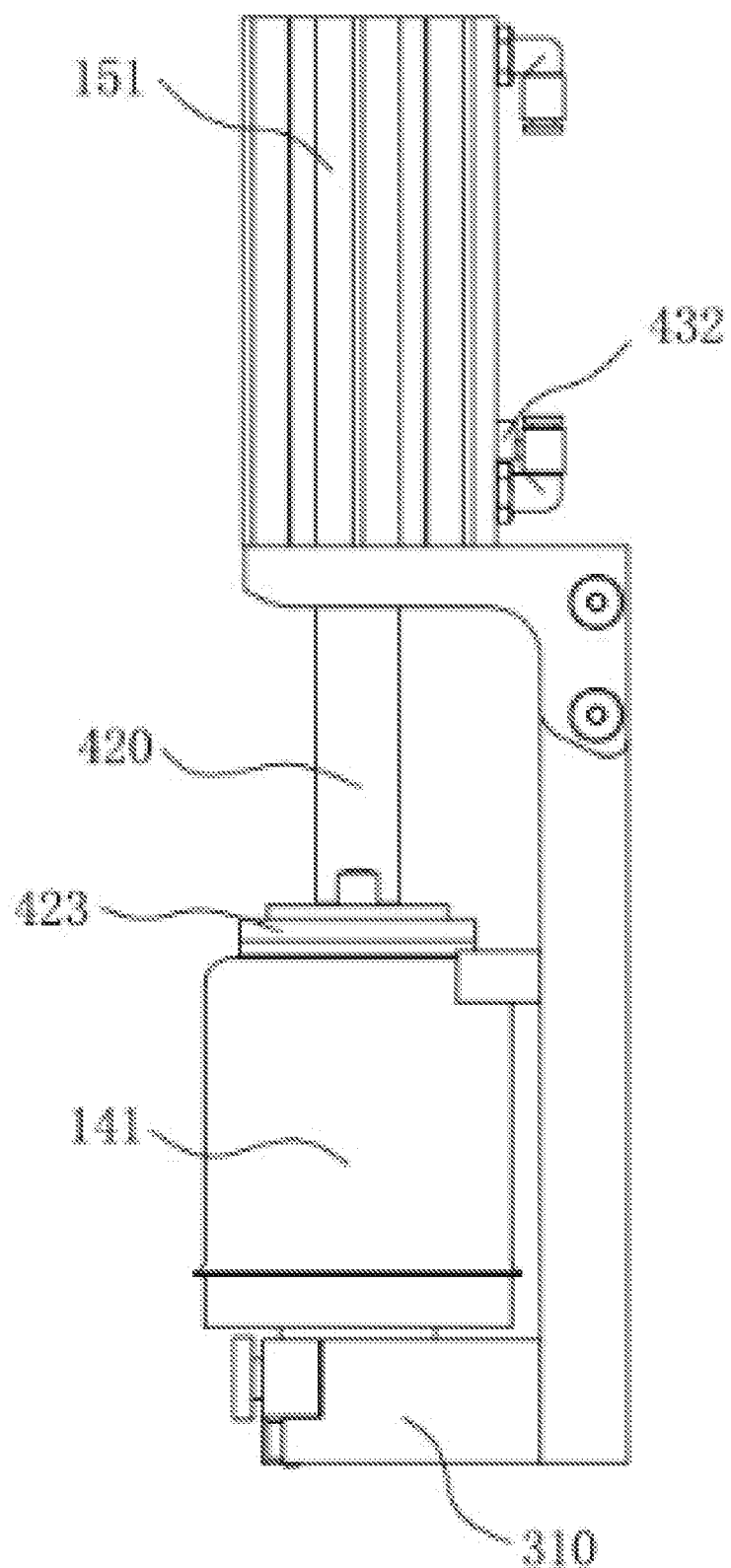
Figure 5E:
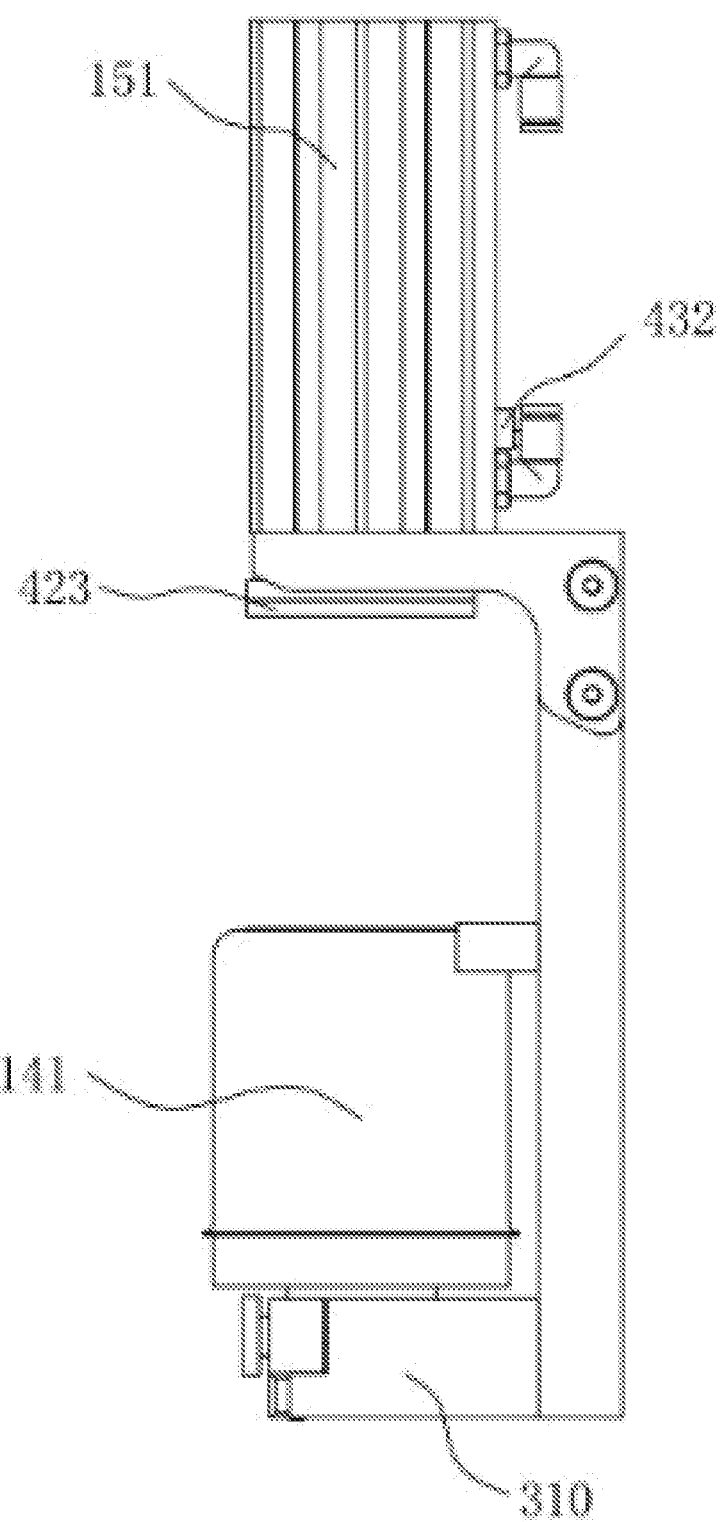

FIGS. 5A to 5E show the process of solder paste extrusion of the first solder paste dispenser, wherein FIG. 5A shows the initial state, FIG. 5B shows the state when the pressure head 423 moves down to touch the bottom surface of the solder paste jar 141, FIG. 5C shows the state when the pressure head 423 presses down the solder paste jar 141 to extrude solder paste, FIG. 5D shows the state when the solder paste in the solder paste jar 141 is completely extruded, and FIG. 5E shows the reset state.

As shown in FIG. 5A, in the initial state, the solder paste jar 141 filled with solder paste is put upside down on the support 320, with the opening facing downward and the bottom surface facing upward. The upper end 321 of the support 320 is inserted into the opening of the solder paste jar 141 and a slipper seal is formed between the upper end and the inner wall of the solder paste jar 141.

As shown in FIG. 5B, the pressure head 423 is driven by the piston rod 420 to move downward to touch the bottom surface of the solder paste jar 141.

As shown in FIG. 5C, the pressure head 423 continues to move downward to press the solder paste jar 141. Solder paste in the solder paste jar 141 is extruded out of the bottom of the base 310 through the through-hole 323 in the support 320 and the circulation hole 312 in the base 310. As the downward stroke of the piston rod 420 and the pressure head 423 continuously increases, solder paste in the solder paste jar 141 is continuously extruded, the solder paste jar 141 also continuously moves downward under the pressure of the pressure head 423, and thus the upper end 321 of the support 320 is inserted into the solder paste jar 141 more deeply. Meanwhile, the magnet ring 431 on the piston rod 420 also moves downward.

As shown in FIG. 5D, when the solder paste in the solder paste jar 141 is completely extruded or only a very small amount is left, the piston rod 420 and the pressure head 423 move downward to the maximum stroke. At this time, the magnet ring 431 reaches a position close to the position of the magnetic switch 432, for example, a position at the same level of the magnetic switch 432. The magnetic switch 432 senses the magnet ring 431 and thus generates a corresponding used solder paste amount signal to indicate that the solder paste in the solder paste jar 141 is used up.

As shown in FIG. 5E, after receiving the used solder signal amount signal from the magnetic switch 432, the controller 170 resets the first driving device 151 and switches the working driving device to the second driving device 152 to use the second solder paste jar 142 and repeat the working processes in FIGS. 5A to 5D to continue with printing operations.

Figure 6:
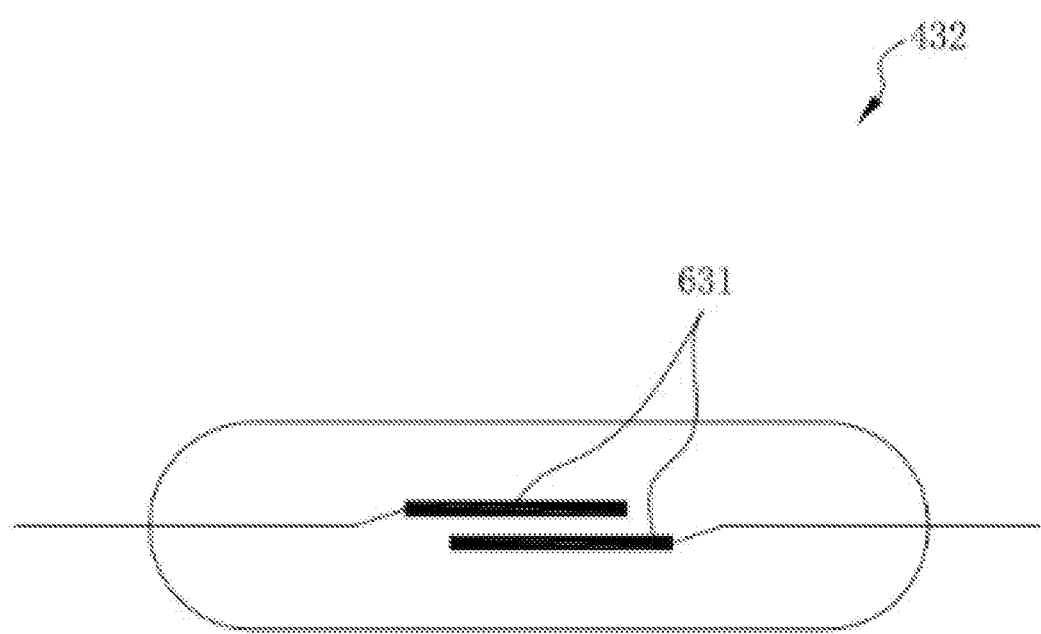
FIG. 6 shows the structure of one embodiment of the magnetic switch.

FIG. 6 shows the structure of one embodiment of the magnetic switch 432. As shown in FIG. 6, the magnetic switch 432 comprises two elastic magnetic reeds 631, which constitute a pair of mechanical contacts in a circuit connection. A small gap exists between two magnetic reeds 631. When the magnetic ring 431 moving together with the piston rod 420 approaches the magnetic switch 432, the magnetic field generated by the magnet ring 431 makes the two magnetic reeds 631 magnetized and come into contact, and thus the circuit is connected and the corresponding electrical signal is generated. After the magnet ring 431 moves far away from the magnetic switch 432, the magnetic field disappears, the two magnetic reeds 631 are demagnetized and return to the original positions, and thus the circuit is disconnected and the electrical signal also disappears.

Figure 7A:
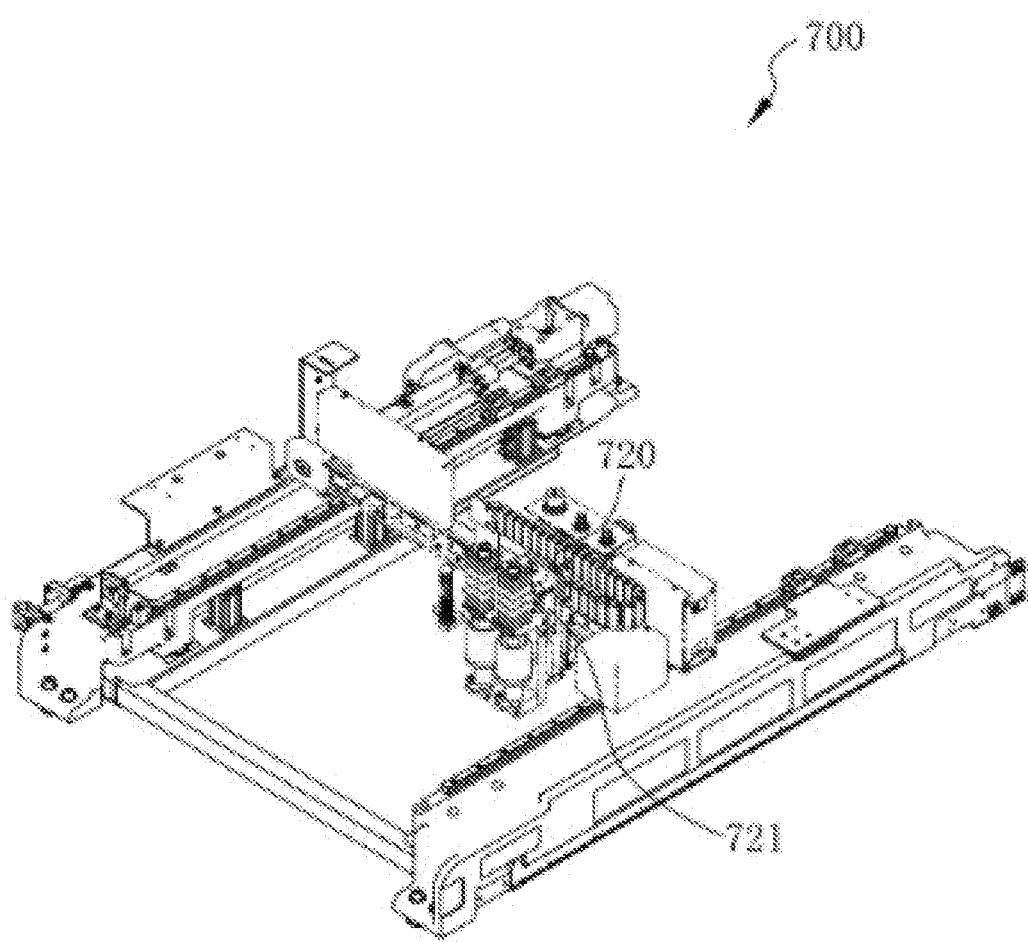
FIG. 7A shows the structure of another embodiment of the stencil printing machine of the present application.
Figure 7B:
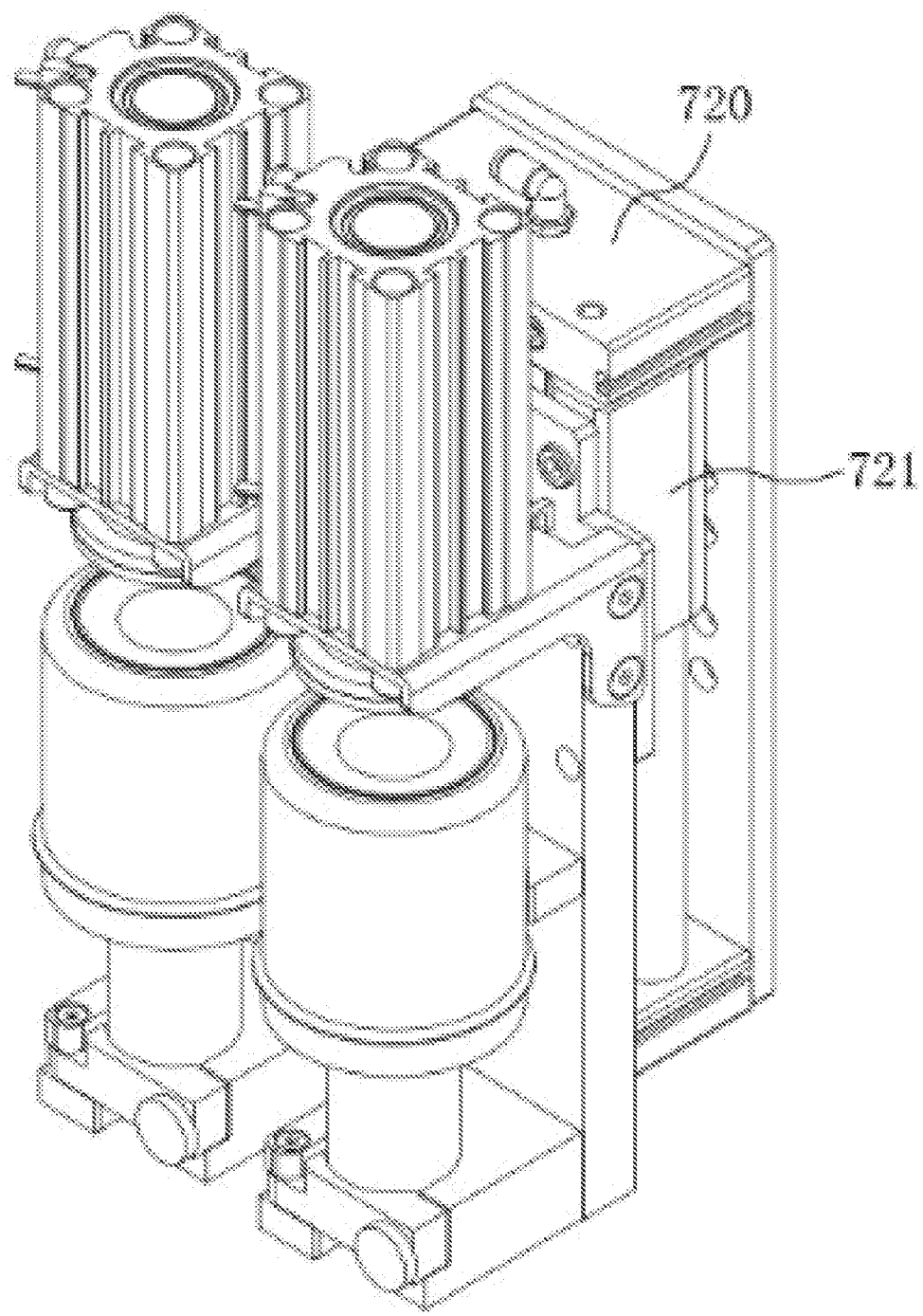
FIG. 7B shows the structure of the second holder device and two solder paste dispensers in the embodiment in FIG. 7A.

FIG. 7A shows the structure of another embodiment of the stencil printing machine 700 of the present application, and FIG. 7B shows the structure of the second holder device 720 and two solder paste dispensers in the embodiment in FIG. 7A. As shown in FIGS. 7A and 7B, the two solder paste dispensers are arranged abreast on the same side of the mobile device 721, different from the embodiment in FIG. 1. The mobile device 721 may comprise only one cylinder, which can simultaneously move two solder paste dispensers vertically. Of course, the mobile device 721 may also comprise two cylinders, which are used to move two solder paste dispensers, respectively.

On the basis of the software and hardware structures of the prior stencil printing machine, a solder paste dispenser is added and an offset is configured for the stencil printing machine provided by the present application. Without making any significant changes to the original operation mode or control mode, the solder paste jar replacement frequency can be lowered significantly, and thus the working efficiency is improved.

In addition, if the structure of the stencil printing machine allows the operation space to accommodate more solder paste dispensers, one or more solder paste dispensers can be added, and thus the solder paste jar replacement frequency is further lowered.

The present application is disclosed by use of examples, one or more of which are illustrated in the drawings. Each example is provided to explain the present application, but not to restrict the present application. In fact, it is obvious to those skilled in the art that various modifications and variations can be made to the present application, without departing from the scope or spirit of the present application. For example, the illustrated or described characteristics as a part of one embodiment can be used together with another embodiment to obtain a further embodiment. Therefore, they are intended to cover all modifications and variations within the scope of the attached claims and the equivalents of the present application.

What is claimed is:

1. A stencil printing machine, comprising:
a first holder device configured to horizontally reciprocate in a portrait orientation,
a mobile device mounted on the first holder device and being configured to be able to horizontally reciprocate in a landscape orientation on the first holder device,
two support tables mounted at a lower end of the mobile device and each of the two support tables being used to bear a corresponding solder paste jar,
two driving devices, the two driving devices being so mounted on the mobile device that each of the two driving devices is located above a corresponding support table, and each of the two driving devices being used to press a corresponding solder paste jar; and
a controller configured to control the movements of the first holder device, the mobile device and the two driving devices,
wherein the mobile device is configured to be able to drive the two support tables and the two driving devices to reciprocate vertically, and
wherein:
the two driving devices include a first driving device and a second driving device, wherein the first driving device and the second driving device are alternately set to a working driving device, and when the first driving device is set to the working driving device, the controller is configured to be able to receive the used solder paste amount signal from a used solder paste amount sensing device corresponding to the first driving device and select the second driving device as the working driving device according to the used solder paste amount signal.

2. The stencil printing machine as claimed in claim 1, wherein:

the two support tables are arranged on two opposite sides of the mobile device so that the two support tables are arranged back to back, or the two support tables are arranged on a same side of the mobile device so that the two support tables are arranged abreast.

3. The stencil printing machine as claimed in claim 1, wherein:

each of the first driving device and the second driving device comprises a cylinder, and the cylinder comprises:

a cylinder body fixed on the mobile device and the cylinder body having a chamber inside, a piston rod arranged in the chamber and configured to be able to vertically reciprocate according to a change of air pressure in the chamber, and the piston rod extending downward to an outside of the cylinder body to form a lower end of the piston rod, and a pressure head connected to the lower end of the piston rod so that the pressure head can vertically reciprocate together with the piston rod.

4. The stencil printing machine as claimed in claim 3, further comprising:

two used solder paste amount sensing devices, each used solder paste amount sensing device of the two used solder paste amount sensing devices being used to sense a stroke of the piston rod of the corresponding driving device and thus sense a used solder paste amount of the corresponding solder paste jar and being configured to generate a used solder paste amount signal of the corresponding solder paste jar when the piston rod moves to a predetermined position.

5. The stencil printing machine as claimed in claim 4, characterized in that the used solder paste amount sensing device comprises:

a magnet ring, the magnet ring being put on the piston rod and being able to move together with the piston rod, and a magnetic switch mounted on an outer side of the cylinder body and the magnetic switch being configured to be able to generate the used solder paste amount signal when the magnet ring moves to a position which is a predetermined distance away from the magnetic switch.

6. The stencil printing machine as claimed in claim 1, wherein each of the two support tables comprises:

a base mounted at the lower end of the mobile device, and a support, a lower end of the support being mounted on the base and a shape of an upper end of the support being configured to match an opening of the corresponding solder paste jar and being used to bear the corresponding solder paste jar, wherein the support has a bottom-to-top through-hole inside and the bottom-to-top through-hole is used to extrude solder paste in the corresponding solder paste jar.

7. The stencil printing machine as claimed in claim 6, wherein:

the base has a downward recessed receiving portion which is used to receive the lower end of the support, wherein the bottom of the downward recessed receiving portion has a circulation hole and one side of the downward recessed receiving portion has an opening communicating with the downward recessed receiving portion, and the base further comprises a baffle, and the baffle is mounted on the one side of the downward recessed receiving portion and is used to open or close the opening.

8. The stencil printing machine as claimed in claim 1, further comprising:

a second holder device, the mobile device being mounted on the first holder device through the second holder device, the first holder device and the second holder device being detachably arranged so that the second holder device can be removed from the first holder device.

9. The stencil printing machine as claimed in claim 1, wherein:

when the first driving device is selected as the working driving device, the controller is configured to control a working position of the first driving device, and when the second driving device is selected as the working driving device, the controller is configured to add a predetermined offset to the working position of the first driving device to obtain the working position of the second driving device.

10. The stencil printing machine as claimed in claim 9, wherein:

the predetermined offset is a distance between centers of circulation holes of the two support tables.

* * * * *